United States Patent [19]

Go

[11] Patent Number: 4,706,166

[45] Date of Patent: Nov. 10, 1987

[54] HIGH-DENSITY ELECTRONIC MODULES—PROCESS AND PRODUCT

[75] Inventor: Tiong C. Go, El Toro, Calif.

[73] Assignee: Irvine Sensors Corporation, Costa Mesa, Calif.

[21] Appl. No.: 856,835

[22] Filed: Apr. 25, 1986

[51] Int. Cl.⁴ .......................... H05K 7/10; H05K 7/12
[52] U.S. Cl. ...................................... 361/403; 357/75; 250/578
[58] Field of Search ............... 361/387, 403, 400, 392, 361/393, 386, 388; 357/75; 250/578

[56] References Cited

U.S. PATENT DOCUMENTS

| | | | |
|---|---|---|---|
| 4,447,857 | 5/1984 | Marks et al. .................. | 361/403 X |
| 4,525,921 | 7/1985 | Carson et al. .................. | 357/75 X |
| 4,551,629 | 11/1985 | Carson et al. .................. | 250/578 |
| 4,617,160 | 10/1986 | Belanger et al. .............. | 250/578 X |

*Primary Examiner*—Roy N. Envall, Jr.
*Attorney, Agent, or Firm*—Thomas J. Plante

[57] ABSTRACT

A high-density electronic module is disclosed, which is suitable for use as a DRAM, SRAM, ROM, logic unit, arithmetic unit, etc. It is formed by stacking integrated-circuit chips, each of which carries integrated circuitry. The chips are glued together, with their leads along one edge, so that all the leads of the stack are exposed on an access plane. Bonding bumps are formed at appropriate points on the access plane. A supporting substrate, formed of a light transparent material, such as silicon, is provided with suitable circuitry and bonding bumps on its face. A layer of insulation is applied to either the access plane or the substrate face, preferably the latter. The bonding bumps on the insulation-carrying surface are formed after the insulation has been applied. The substrated face is placed on the access plane of the stack, their bonding bumps are microscopically aligned, and then bonded together under heat and/or pressure. A layer of thermally conductive (but electrically non-conductive) adhesive material is inserted between the substrate and stack. The substrate and stack combination is then placed and wire bonded in a protective container having leads extending therethrough for external connection.

17 Claims, 16 Drawing Figures

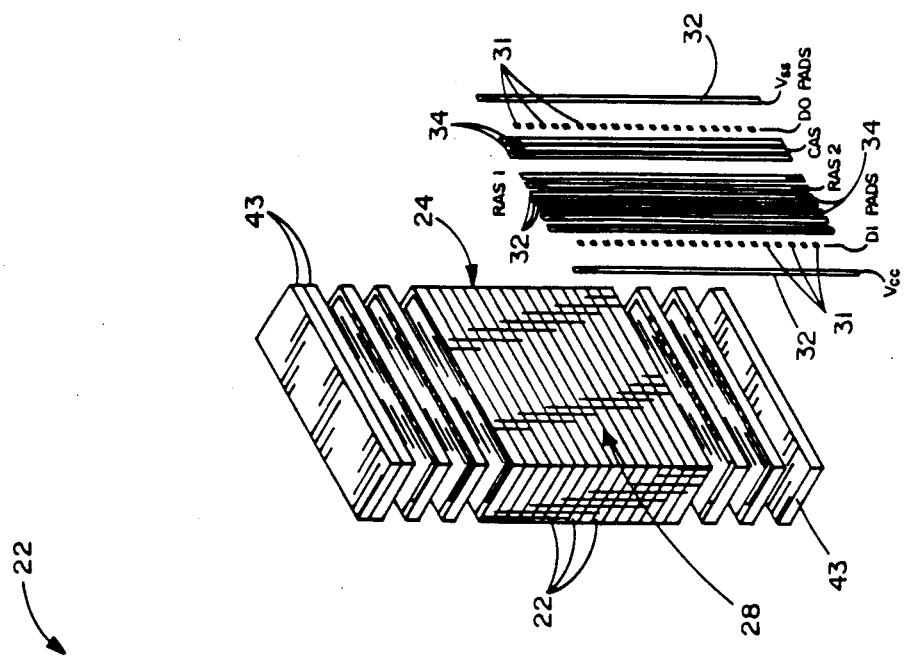
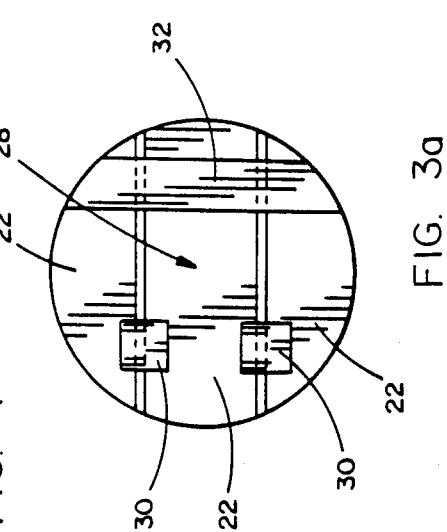
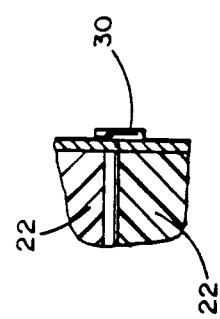
FIG. 1
FIG. 2a
FIG. 2b
FIG. 3a
FIG. 3b

HIGH-DENSITY ELECTRONIC MODULES—PROCESS AND PRODUCT

BACKGROUND OF THE INVENTION

This invention relates to high-density electronic modules, which are intended to meet the apparently insatiable desire for incorporating more electronic capacity in a given space, or reducing the space required for a given amount of electronic capacity.

One of the primary uses of the present invention is to provide memory modules for use in computer apparatus. However, the same concepts may be applied to any field where high-density of electronic circuitry is desired.

To a significant extent, the background of this invention is provided by patented (or applied for) inventions assigned to the assignee of this application. Those inventions relate to the stacking and integrating of multiple chips, or substrates, each carrying integrated circuitry (IC). The stacked chips provide a module having a multiplicity of electrical leads exposed on at least one access plane of the module, the planes in which the chips extend being perpendicular to the access plane.

In U.S. Pat. No. 4,551,629, issued Nov. 5, 1985, the modules of stacked chips are intended to be used in conjunction with photodetectors, which are secured to one access plane of the module, and which comprise a dense array of radiation/electronic transducers.

In U.S. Pat. No. 4,525,921, issued July 2, 1985, similar modules, comprising stacked, circuit-carrying chips, are intended for general use, including the computer memory components mentioned above.

The present invention is intended to solve problems involved in creating easily handled, reliable components for use as computer memories, control logic, arithmetic units, and the like.

SUMMARY OF THE INVENTION

In the present invention, a module of stacked IC chips (e.g., essentially standard silicon IC chips) is itself supported on a substrate with its access plane resting directly on the substrate.

A metallization pattern of electrical conductors is applied to the access plane of the module, e.g., by means of vacuum and photo-lithography processes. A metallization pattern of electrical conductors is also applied to the face of the substrate. A layer of insulation (passivation) is provided between the access plane of the module and the adjacent face of the substrate.

Bumps of electrically-conducting bonding metal, such as indium, copper or gold, are deposited on each of the interengaging surfaces, in matched positions. Then the electrical conduction systems of the two interengaging surfaces are electrically connected by bump bonding (also termed flip-chip bonding) to cause electrical bonding of matching bumps on the two surfaces. The substrate-supported module is then enclosed in a protective housing, through which extend electrical conductors which provide external connections.

In order to facilitate production, the material of the module-supporting substrate should be light transparent to either visible or infrared radiation, so as to permit microscopic alignment of the bonding bumps on the access plane of the module with the bonding bumps on the adjacent face of the substrate.

BRIEF DESCRIPTION OF THE DRAWINGS

FIG. 1 is a plan view of a standard silicon chip, which has been modified to provide edge leads along one longitudinal edge of the chip;

FIGS. 2A and 2B show isometrically a partially exploded view of a stack of circuit-carrying chips which are glued together to form a module, and the pattern of the metallization formed on the access plane of the module;

FIGS. 3A and 3B are greatly enlarged views of a small portion of the face of the access plane, and of a partial cross-section of FIG. 3A, showing the relation of the IC circuitry to the metal conducting elements on the surface of the access plane;

DETAILED DESCRIPTION OF PREFERRED EMBODIMENT

Figure 4A:
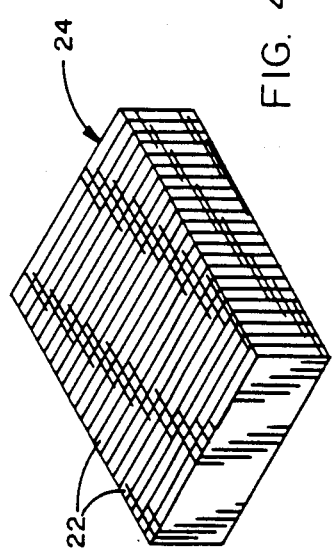
FIGS. 4A, 4B and 4C show isometrically an exploded view of the stack and its conductor metallization ready to be secured to the supporting substrate, the stack and the substrate having matching conductive "bumps" ready to be bump-bonded.
Figure 4B:
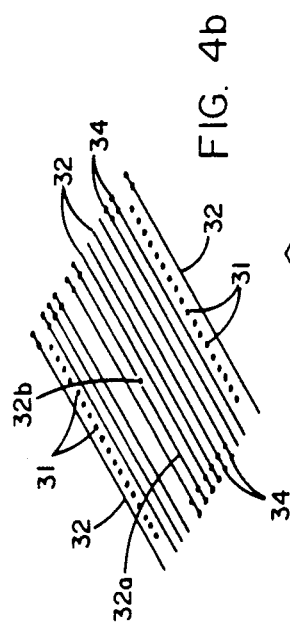
Figure 4C:
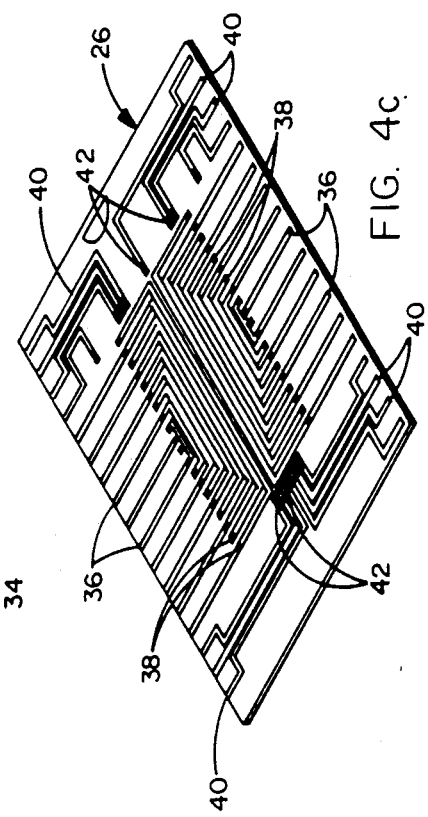

The present invention can be best explained by beginning with FIGS. 4A, 4B and 4C. In order to provide an electronic module having a much greater electronic density (in terms of PC board area) than prior devices, it is proposed to stack and glue together a number of chips 22, each of which carries integrated circuitry, and to mount the integrated chip stack 24 as a unit on a substrate 26. The substrate 26 supports the stacked chips and provides circuitry leading into and out of the access plane of the chip stack via the conductive bumps.

The use of stacked IC chips (usually silicon) was originally developed by the assignee of this application as a means of locating extensive electronic circuitry at the focal plane of a two-dimensional detector array. The present application is directed toward an electronic package which is particularly useful in such apparatus as computers, for which it provides a module capable of containing extensive memory, control logic, arithmetic units, etc. Two modules which have been the subject of extensive effort have been Read Only Memories (ROMs) and Dynamic Random Access Memories (DRAMs).

The module shown in FIG. 4A is intended to be used as a DRAM the stack having 20 IC silicon chips, 18 of which are active, and 2 of which are spares. The spares are for production redundancies, and will not be connected to the pins on the package unless used to substitute for defective chips. It also has blank silicon chips at each end of the stack to provide space for terminal pads. A ROM might have 8 active IC chips in the stack. In addition to the IC chips, blank chips are needed at the ends of the stack, as explained below.

FIG. 1 shows a single chip 22 intended for use in a DRAM module. Each chip can be essentially a standard memory chip except that it is modified to provide all the electrical leads (to external circuitry) on a single edge of the chip, preferably along the long side of the rectangular area. The voltage connections Vcc, Vss and Vbb, are each bussed to provide common voltage to all chips. Each chip has its own data in (DI) and data out (DO) connections. The symbol RAS indicates row access select, and the symbol CAS indicates column access select, which selects the desired chip. The terminals A0–A7 carry intra-chip address signals. The $\overline{WE}$ terminal is the write enable connection.

A plurality of chips is stacked to provide a module, as shown in FIGS. 2A, 3A and 4A. All of the electrical leads (to external circuitry) on all of the chips will be on a single access plane 28 of the stacked module. This access plane will lie on the surface of supporting substrate 26, and will have suitable electrical connections thereto, preferably accomplished by a bump-bonding process (also called "flip-chip" bonding).

The process used in stacking the chips and securing them together preferably will be similar to that covered in application Ser. No. 674,096, filed Nov. 23, 1984, and titled "Apparatus and Method for Fabricating Modules Comprising Stacked Circuit-Carrying Layers". In that process, the chips, supplied by a vendor in the modified form, each has its thickness measured, and is placed in an appropriate storage location depending on its thickness characterization. The chip thickness data is used in a production control computer program to determine the optimum stacking order for a given module. Then the chips are cleaned and stacked, and a measured amount of epoxy is deposited between the faces of each pair of adjacent chips. The stack is placed under pressure perpendicular to the planes of the chips, in order to confine the stack to a fixed height. And then curing of the epoxy under heat is used to provide an integrated stack.

In comparing the earlier focal plane modules to those of the present application, which are intended for use in different apparatus, there is a significant trade-off. The focal plane leads, each of which connects to a separate detector, can tolerate a reasonable amount of outage, i.e. non-functioning connections (or detectors) in a given two-dimensional array. The devices provided by the present application, such as computer memory devices, cannot tolerate any connection failures.

On the other hand, the detector leads on a focal plane need to be very close to one another, e.g., four mils center-to-center, or less. This applies both to the X-axis, which is considered to extend along the edges of the chips, and to the Y-axis, which is perpendicular to the planes of the chips. This requires the use of very thin, and therefore fragile, chips. Additionally, the position tolerances of the electrical leads are very limited.

In the present application, the center-to-center distances of the leads may be in the range of 10–20 mils. This means thicker, less fragile chips may be used, and the areas of the electrical terminals (bumps) and metallic conducting stripes can be substantially larger. Obviously, this simplifies significantly certain problems involved in fabrication of the modules.

After a stack 24 has been formed, it may be necessary (if the chips are semiconductors instead of other material such as sapphire) to cover the access plane 28 with insulation (passivation), except at the points where the electrical conductors on the edges of the chips must be accessible for connection to other circuitry. This is preferably accomplished by using the process covered by U.S. Pat. No. 4,525,921, referred to in the Background of the Invention.

Briefly, this process comprises: (1) grinding and lapping the access plane to expose the leads; (2) plasma etching the silicon on the access plane 28 to remove silicon around the leads, which remain protruding from the access plane; (3) coating the access plane with a passivation layer, using a material such as polyimide; and (4) lapping again to expose the leads, while the remainder of the access plane remains insulated. If the IC layer substrate materials have little or no conductivity, e.g., gallium arsenide or silicon-on-sapphire, passivation would not be necessary.

The next step is applying metallization to the access plane, in order to provide electrical connections for the leads on the stacked chips. In some instances, the metallic conductor will be a pad 30 contacting only one lead on one chip, which pad may have an area of 8 mils by 8 mils. In other instances, the metallic conductor will be a strip 32 contacting leads on a plurality of chips, which strip may have a width of 8 mils. The metal pads, or conductors, may have a center-to-center spacing from one another of 10–20 mils. The metallization may be applied by any desired process for obtaining printed circuitry, such as photolithography, in which a layer of photo-resist material is masked and then exposed, using ultraviolet light, in order to open windows in the photoresist so that unwanted areas of the previously deposited metal can be etched away, leaving the desired conductor pattern.

FIGS. 3A and 3B show greatly enlarged close-up views of the IC leads on a silicon chip, the epoxy glue lines between adjacent stacked chips, and the metal pads 30 and strips 32 deposited on the access plane and in electrical contact with the IC leads. They also show the passivation layer covering the access plane, except where the IC leads are exposed. FIG. 3A is a front view of a small portion of the access plane (or active face) of the stack. FIG. 3B shows a cross-section which illustrates a metal pad in engagement with the end of an IC lead, but insulated from the silicon layers.

FIGS. 2B and 4B show the conductor pattern on access plane 28 of integrated stack 24 after bonding bumps have been formed thereon, and prior to bonding of access plane 28 to substrate 24. Metallic bonding bumps 31 have been deposited on each of the metal pads 30. Also, metallic bonding bumps 34 have been deposited on the metallic strips 32, preferably in pairs to provide redundancy. The bump-depositing process is described below. The bump material should be very ductile, in order to avoid cracking under thermal stress. Indium is the preferred bump material, but copper and gold are other possibilities.

As shown in FIG. 4C, the substrate 24 also has a pattern of metallic conductors on its surface, preferably formed by the metallization process described above. The substrate has metallic strips 36 opposite stack 24, whose terminal pads have bumps 38 deposited thereon. These bumps will be subsequently bonded to the bumps 31 on the access plane. The substrate also has metallic strips 40 beyond the ends of stack 24, whose terminal pads have redundant pairs of bumps 42 thereon, which will be bonded to the bumps 34 on the access plane.

The bonding bumps 38 and 42 formed on the substrate 24 are exactly matched in location to the bonding bumps 31 and 34 formed on the access plane 28 of chip stack 24. This permits the interior (chip circuitry) and exterior (lead out and lead in) electronic circuits to be interconnected by a bump-bonding (flip-chip bonding) process. Because the interengaging bonding bumps 34 and 42 are formed on bussing line terminals, blank cover chips 43 are needed at the ends of the stack, in order to provide space for bonding the strips 32 on the stack to the strips 40 on the substrate.

Before the facing access plane and circuit-carrying substrate can be electrically interconnected by bump-bonding, one of the two surfaces must be covered with passivation (insulation) material, on which only the bumps are exposed. The indium material which constitutes the bumps is preferably deposited after the insulation layer has been formed, or deposited on, the surface.

It is preferable to form the insulation layer on the substrate, because it is much easier to work with. The substrate is preferably formed of silicon, because it has the same thermal coefficient of expansion as the stack, and it is transparent to infrared radiation. This transparency is helpful during the bump-bonding process. Other infrared or visible transparent substrate materials might be used (e.g., a sapphire substrate will be used in silicon-on-sapphire devices).

A satisfactory insulation layer may be formed by depositing a layer of silicon dioxide (SiO), using, for example, a sputtering process. After the entire surface of the substrate 24 has been covered with insulation, it is necessary to make holes in the insulation to permit bonding of the indium bumps 38 and 42 to the respective strips 36 and 40. The holes should not extend beyond the width of the metallic strips, because the bump bonding material should not be short-circuited to the adjacent conductors (by "shadowing").

Various experiments are tried unsuccessfully in efforts to deposit indium bumps in electrical contact with the metal terminals on the substrate. Use of "evaporate-through" mask techniques tended to cause a shadowing effect. And the use of a wet chemical etch, in an effort to eliminate this shadowing, caused damage of both the bumps and the electrical leads.

An apparent solution is provided by the use of "photo-resist lift-off". A 10-15 micron thick photoresist takes the place of the evaporate-through mask. The holes are created by selectively exposing and developing the photo-resist, then removing the photoresist where the bumps will be deposited. Thereafter, the indium is deposited on the exposed metal terminals and on top of the photoresist. The indium on the photoresist is removed by lifting the photoresist off of the surface, leaving indium bumps on the terminals. Each indium bump should cover substantially the same horizontal area as the area of the terminal it contacts.

The process of bump deposition on access plane 28 is similar, except that an insulation layer is not required.

In the bump bonding process, the chip stack 24 is so placed that the access plane 28 is the top surface. Then the substrate 26 is placed face down on the access plane, in order to bring the indium bumps into engagement with one another. Using an infrared microscope which "sees" through the silicon substrate, the matching bumps are brought into alignment. Then they are bonded, using heat and pressure to form welded joints.

Figure 5:
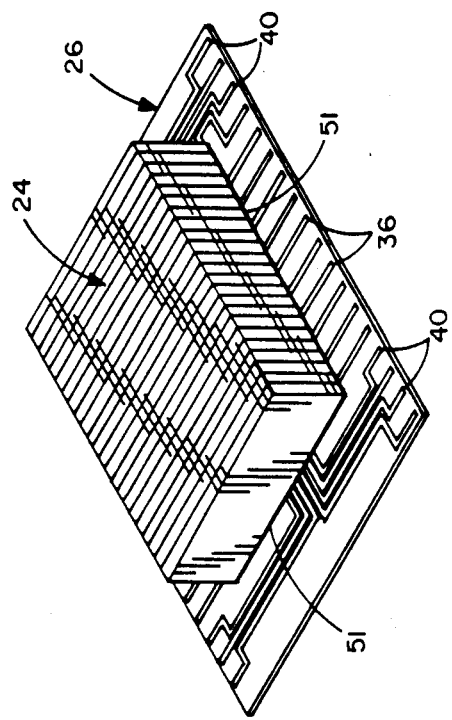
FIG. 5 is an isometric view of the stack of chips mounted on the substrate.
Figure 6:
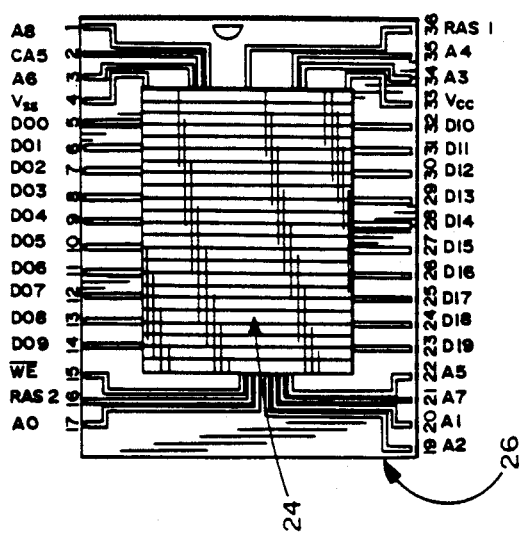
FIGS. 6 and 7 are plan and side views, respectively, of the structure of FIG. 5.
Figure 7:
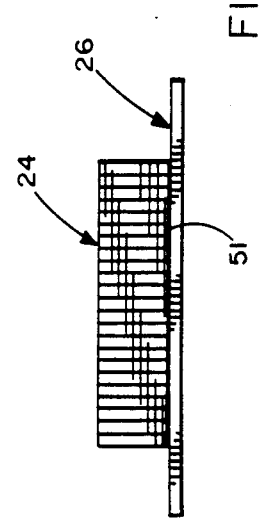

FIGS. 5-7 show the completed stack/substrate subassembly. The metallic strips on the substrate extend to its opposite long-dimension edges, in order to be readily connected to external circuitry.

Figure 8A:
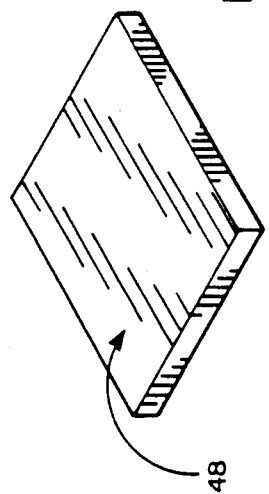
FIGS. 8A, 8B and 8C show isometrically a partially exploded view of the stack-carrying substrate and the upper and lower portions of its housing.
Figure 8B:
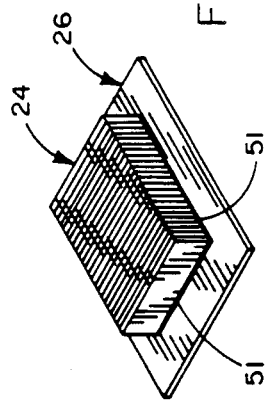
Figure 8C:
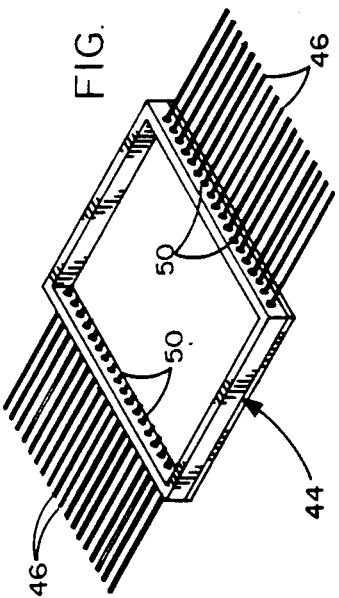
Figure 9:
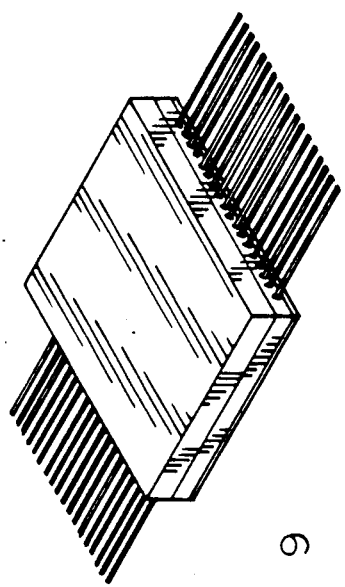
FIG. 9 is an isometric view of the encapsulated substrate/chip structure.

FIGS. 8A, 8B and 8C show the container, or housing, in which the chips and substrate are placed. FIG. 8C shows the lower portion 44 of the container (a flatpack), from which extend electrical leads 46, the inner ends of which are wire bonded to the metal strips on the substrate. The package is completed by welding an upper portion, or cover, 48 (FIG. 8A) to the lower portion 44, thereby enclosing the stack/substrate subassembly. Preferably the container parts 44 and 48 are metal, in order to permit heat dissipation. This necessitates having insulation rings 50 between each electrical lead 46 and the container walls. FIG. 9 shows the complete encapsulated package.

Power dissipation is a limiting factor in circuit density. Therefore, heat transfer from the IC chips is a significant consideration. In order to permit heat flow from the IC chips to the substrate 26, it is important, after bump bonding, to fill the gap between the chip stack and the substrate with a thermally-conductive (but electrically non-conductive) material 51. This is accomplished with a suitable epoxy, which provides a strong bond as well as heat dissipation.

Figure 10:
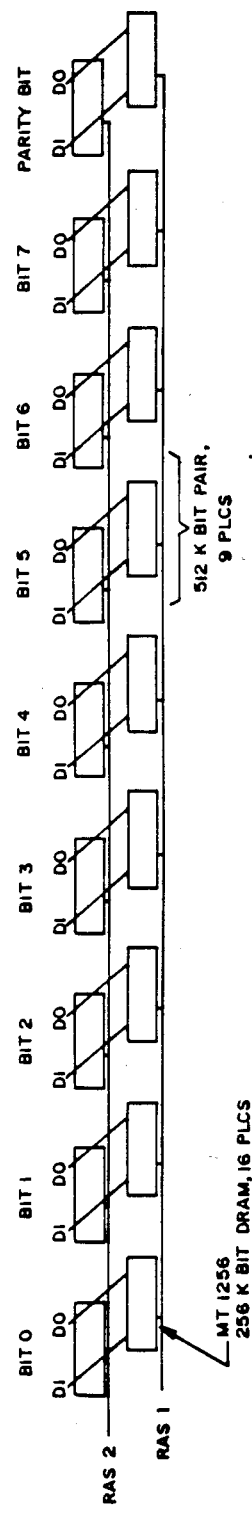
FIG. 10 shows an electrical connection arrangement for use in providing a 512K×8 DRAM module using 256K chips in a stack.

FIG. 10, considered in conjunction with FIGS. 4B and 4C, provides a particular DRAM circuit, which is designed to use 18 chips, each having 256K memory capability, in serial pairs, thereby providing a 512K×8 DRAM module (with a parity bit). Each bit, from Bit 0 through Bit 7 (and the parity bit), combines two chips, by interconnecting their data in and data out lines. Row access lines RAS1 and RAS2 each connect to half of the chips. Nine column access lines are provided to access the eight bit pairs and a parity bit.

Providing these nine pairings is not a trivial problem. The normal assumption would be that adjacent chips should be paired. But such pairing would create an almost insurmountable conductor cross-over problem on the substrate.

One solution is illustrated in FIGS. 4B and 4C. Each line 36 on substrate 24 is connected to two chips. The lines 36 on one side of the substrate connect to the data-in pads on the chips, and the lines 36 on the other side of the substrate connect to the data-out pads on the chips. A first line 36 interconnects the two end chips. A second line 36 interconnects the two chips closest to the respective end chips. A third line 36 interconnects the next two chips closest to the respective end chips; and so on, until the last two interconnected chips are adjacent to one another.

On the access plane of the stacked chips, one of the strips 32, which is designated 32A, has a gap at 32B because the group of chips on one side of the gap have a common row access line, and the group of chips on the other side of the gap have a common row access line, which is not connected to the first group. This simple busing arrangement of the row access lines would not be possible if each chip were not paired with a chip on the other side of the gap, i.e., a chip in the other group.

From the foregoing description, it will be apparent that the process and product dislosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. A method for fabricating a module containing high-density electronic circuitry, comprising:
   providing a plurality of integrated circuit chips, each having a multiplicity of closely-spaced electrical leads at an access side thereof;
   stacking and bonding the integrated circuit chips in a structure having an access plane which includes the access sides of the stacked chips, on which plane there is a two-dimensional array of closely-spaced electrical leads;
   forming on the access plane, in electrical contact with the leads a plurality of conductive lines and a plurality of conductive terminals;
   providing a substrate adapted to support the stacked chips and having printed thereon circuitry including a plurality of conductive lines and a plurality of conductive terminals;
   the conductive terminals on the access plane being located in precise matched relationship with the conductive terminals on the substrate;
   covering either the substrate or the access plane with a layer of insulation having openings therethrough matched to the conductive terminals thereon;
   depositing electrically conducting bonding bumps on the conductive terminals of both the access plane and the substrate;
   aligning the bonding bumps on the substrate with those on the access plane; and
   using heat and/or pressure to bond the aligned bonding bumps together, thereby providing a plurality of spaced electrical connections between the access plane and the substrate.

2. The method of claim 1 wherein the substrate is transparent to certain radiation wavelengths, and alignment of the bonding bumps on the access plane with those on the substrate is accomplished by directing such radiation through the side of the substrate opposite its circuit-carrying side.

3. The method of claim 1 wherein the space remaining between the access plane and the substrate after the bump bonding process is filled with a thermally-conductive, electrically-non-conductive adhesive.

4. The method of claim 1 which also comprises:
   providing a container inside which the bonded substrate and stacked chips are located, the container having electrical leads extending therethrough; and
   electrically connecting electrical conductors on the substrate to the electrical leads extending through the container.

5. A high-density electronic module comprising:
   a plurality of IC chips, each having electrical leads extending to one side of the chip;
   the chips being secured together to provide an integrated stack, in which all the electrical leads extend to a single two-dimensional access plane;
   a supporting substrate which has electrical circuitry thereon, and which is adapted to provide a support for the stacked chips;
   a first group of bonding bumps deposited on the access plane of the stack;
   a second group of bonding bumps deposited on the substrate;
   insulation on either the stack or the substrate which covers its surface except for the bonding bumps;
   each bonding bump on the stack being bonded to a bonding bump on the substrate, thereby providing electrical contact between the stack and substrate at selected terminals.

6. The module of claim 5 which also comprises:
   a layer of thermally-conducting adhesive material between the stack and the substrate except where the bonding bumps are in interengagement.

7. The module of claim 5 which also comprises:
   a container which encloses the stack-substrate combination; and
   electrical leads which are in contact with leads on the substrate, and which extend through the container to provide external terminals.

8. The module of claim 6 which also comprises:
   a container which encloses the stack-substrate combination; and
   electrical leads which are in contact with leads on the substrate, and which extend through the container to provide external terminals.

9. The module of claim 8 in which the container is formed of metal, and is insulated from the electrical leads which extend through it.

10. The module of claim 5 wherein the electronic circuitry provides:
    circuitry on the substrate adapted to interconnect the chips in pairs, with no crossover of pair-interconnect leads;
    two row access leads, each of which provides a common bus to half of the chips; and
    column access leads, each of which provides a common bus to all of the chips.

11. The module of claim 10 in which the circuitry on the substrate comprises:
    a first U-shaped line interconnecting the two end chips;
    a second U-shaped line located inside the first line and interconnecting the two chips closest to the respective end chips;
    one or more additional U-shaped lines each interconnecting the two chips closest to the chips of the previous line; and
    a final line interconnecting the two chips which are adjacent to one another.

12. The method of claim 1 in which the bonding bumps on both the access plane and the substrate are formed of indium.

13. The method of claim 3 in which the bonding bumps on both the access plane and the substrate are formed of indium.

14. The method of claim 1 in which the bonding bumps on both the access plane surface and the substrate surface are deposited on their respective terminals by:
    depositing a layer of photo-resist on the surface;
    selectively exposing and developing the photo-resist to make it removable only at the terminals;
    removing the photo-resist at the terminals;
    depositing a layer of bonding-bump material covering the photo-resist layer and the exposed terminals; and
    lifting the photo-resist off the surface in order to remove all of the bonding bump material except the bumps which contact the terminals.

15. The module of claim 5 in which the bonding bumps on both the access plane and the substrate are formed of a highly ductile metal.

16. The module of claim 15 in which the bonding bump material is indium.

17. The module of claim 5 in which the stack of chips includes:
    one or more spare chips which are available as redundant replacements for non-functioning chips.

* * * * *